(12) United States Patent
Binnard et al.

(10) Patent No.: US 6,504,162 B1
(45) Date of Patent: Jan. 7, 2003

(54) STAGE DEVICE, CONTROL SYSTEM, AND METHOD FOR STABILIZING WAFER STAGE AND WAFER TABLE

(75) Inventors: Michael Binnard, Belmont, CA (US); Toshio Ueta, Redwood City, CA (US)

(73) Assignee: Nikon Corporation, Tokyo (JP)

( * ) Notice: Subject to any disclaimer, the term of this patent is extended or adjusted under 35 U.S.C. 154(b) by 286 days.

(21) Appl. No.: 09/662,843

(22) Filed: Sep. 15, 2000

(51) Int. Cl.[7] .......................... H01J 37/304; G21K 5/10
(52) U.S. Cl. ................... 250/492.2; 250/442.11
(58) Field of Search .................... 250/492.2, 442.11

(56) References Cited

U.S. PATENT DOCUMENTS

| | | | |
|---|---|---|---|
| 4,615,093 A | * 10/1986 | Tews et al. | ............... 29/407.04 |
| 4,952,858 A | 8/1990 | Galburt | |
| 5,504,407 A | * 4/1996 | Wakui et al. | ............ 318/568.17 |
| 5,737,063 A | * 4/1998 | Miyachi | ................ 250/559.37 |
| 6,008,610 A | * 12/1999 | Yuan et al. | ................... 318/592 |
| 6,172,373 B1 | * 1/2001 | Hara et al. | ................... 250/548 |
| 6,260,282 B1 | * 7/2001 | Yuan et al. | ................... 33/1 M |
| 6,281,643 B1 | * 8/2001 | Ebihara | ....................... 318/135 |
| 6,329,780 B1 | * 12/2001 | Ebihara et al. | ............. 318/597 |
| 6,381,004 B1 | * 4/2002 | Hagiwara et al. | ............. 355/53 |

* cited by examiner

*Primary Examiner*—Bruce Anderson
(74) *Attorney, Agent, or Firm*—Finnegan Henderson Farabow Garrett & Dunner, L.L.P.

(57) ABSTRACT

A wafer stage device and control system are provided to stabilize a wafer stage and a wafer table in a wafer manufacturing process. The wafer table supports the semiconductor wafer, while the wafer stage is accelerated in response to a wafer manufacturing control system to position the wafer table. The wafer stage device includes a set of flexures connecting the wafer table to the wafer stage. The flexures are positioned in a plane which is substantially in alignment with an upper surface of the wafer. The flexure's configuration causes a rotational error, such as pitching or rolling, of the wafer table as the wafer stage moves. The wafer stage device further includes a plurality of actuators to control the rotational error by exerting a stabilizing torque to the wafer table. The control system determines the stabilizing torque necessary to correct the pitching or rolling error of the wafer table.

41 Claims, 9 Drawing Sheets

STAGE DEVICE, CONTROL SYSTEM, AND METHOD FOR STABILIZING WAFER STAGE AND WAFER TABLE

BACKGROUND OF THE INVENTION

1. Field of the Invention

This invention relates to a wafer stage device, control system, and method for stabilizing a wafer stage and a wafer table in a photolithography process to manufacture semiconductor wafers. More particularly, this invention relates to a device, control system, and method for stabilizing the wafer stage and the wafer table to prevent pitching and rolling motions of the wafer table when the wafer stage moves.

2. Description of the Related Art

In manufacturing integrated circuits using photolithography, light is transmitted through non-opaque portions of a pattern on a reticle, or photomask, through a projection exposure apparatus, and onto a wafer of specially-coated silicon or other semiconductor material. The uncovered portions of the coating, that are exposed to light, are cured. The uncured coating is then removed by an acid bath. Then, the layer of uncovered silicon is altered to produce one layer of the multi-layered integrated circuit. Conventional systems use visible and ultraviolet light for this process. Recently, however, visible and ultraviolet light have been replaced with electron, x-ray, and laser beams, which permit smaller and more intricate patterns.

As the miniaturization of a circuit pattern progresses, the focus depth of the projection exposure apparatus becomes very small, making it difficult to align accurately the overlay of circuit patterns of the multi-layered integrated circuit. As a result, a primary consideration for an overall design of the photolithography system includes building components of the system that achieve precision by maintaining small tolerances. Any vibration, distortion, or misalignment caused by internal, external or environmental disturbances must be kept at minimum. When these disturbances affect an individual part, the focusing properties of the photolithography system are collectively altered.

It has been proposed to provide a conventional wafer stage device 100 as shown in FIGS. 1 and 2. In the device 100, a wafer table 104 supports a semiconductor wafer 68. A wafer stage 66 positions wafer 68 as wafer stage 66 is accelerated by a wafer stage force $F_s$ generated in response to a wafer manufacturing control system (not shown). A set of flexures 106 connects wafer table 104 to wafer stage 66. According to the conventional wafer stage device 100, flexures 106 are positioned on a plane A that is substantially in alignment with the center of gravity (c.g.) of wafer table 104. When wafer stage force $F_s$ acts on wafer stage 66, flexures 106 apply a wafer table force $F_t$ in plane A on wafer table 104.

The conventional wafer stage device 100 has several disadvantages, including a leveling shift problem. A leveling shift problem occurs because flexures 106 and an upper surface of wafer 68 are separated by a distance $D_1$ along the z axis. In some embodiments, distance D, may be as large as 30–40 mm. This separation leads to a horizontal shift in the position of wafer 68 when wafer table 104 is tilted to maintain proper focus. The horizontal shift along the x- and y- directions as measured by an interferometer reflected from mirror 110 can be expressed as follows:

$X_{shift} = D_1 \cdot \alpha_y$ $Y_{shift} = D_1 \cdot \alpha_x$ whereby, $\alpha_x$, and $\alpha_y$ are the tilt angles of wafer table 104 with respect to the x and y axes, respectively.

In light of the foregoing, there is a need for a wafer stage device, control system, and method for stabilizing the wafer stage and the wafer table so that the pattern on the reticle can be accurately projected onto the semiconductor wafer during exposure in the wafer manufacturing process. Particularly, there is a need for a wafer stage device that can overcome the leveling shift problem and minimize pitching and rolling errors.

SUMMARY OF THE INVENTION

The advantages and purposes of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and consistent with the principles of the invention, as embodied and broadly described herein, a first aspect of the invention is a wafer stage control system, comprising a first feedforward control system to determine a stabilizing force to be exerted onto a wafer table to counteract a rotational motion of the wafer table caused by an acceleration of a wafer stage, and a second feedforward control system to determine a correction force to-be exerted on the wafer stage to correct a leveling shift caused by a rotation of the wafer table.

A second aspect of the present invention is a method for operating a wafer stage and wafer table control system. The method comprises the steps of determining a stabilizing force to be exerted on a wafer table to counteract a rotational motion of the wafer table caused by an acceleration of a wafer stage, and determining a force to be exerted on the wafer stage to counteract a leveling shift of the wafer table due to a rotation of the wafer table.

A third aspect of the present invention is a method for operating a wafer stage and wafer table control system. The method comprises the steps of creating a wafer stage loop to correct a wafer stage position error, a wafer stage acceleration reference signal being an input to the wafer stage loop, and creating a wafer table loop to correct a wafer table position error. The method also comprises the steps of inputting the wafer stage acceleration reference signal to the wafer table loop to determine a stabilizing force to be exerted onto the wafer table to counteract a rotational motion of the wafer table caused by an acceleration of the wafer stage, and determining a force to be exerted on the wafer stage to correct a leveling shift of the wafer table due to a rotation of the wafer table.

A fourth aspect of the present invention is a method for stabilizing a wafer table in a wafer manufacturing apparatus. The wafer table supports a wafer, and the wafer stage is being subject to acceleration in response to a wafer manufacturing control system to position the wafer table. The method comprises the steps of generating a wafer stage force to be exerted onto a wafer stage to correct a position error of the wafer stage, and generating a wafer table force to be exerted onto a wafer table to correct a position error of the wafer table. The method also comprises the steps of generating a stabilizing force to be exerted onto the wafer table to counteract a rotational motion of the wafer table caused by acceleration of the wafer stage, and generating a correction force to be exerted onto the wafer stage to compensate leveling shift of the wafer table.

A fifth aspect of the present invention is a method for making a wafer stage device to manufacture semiconductor wafers. The method comprises the steps of aligning at least one flexure in a plane with a wafer, the wafer being supported by a wafer table and positioned by a wafer stage, and restraining shifting motion of the wafer table in the plane aligned with the wafer, while allowing the wafer table to move in a direction normal to the plane. The method also comprises the step of generating a stabilizing force to stabilize the wafer table when the wafer stage is accelerated.

A sixth aspect of the present invention is a wafer stage device for manufacturing semiconductor wafers, comprising a wafer stage to position a wafer, the wafer stage being subject to acceleration in response to a wafer manufacturing control system, and a wafer table to support the wafer, the wafer table having a predetermined center of gravity. The wafer stage device also comprises a set of flexures connecting the wafer table and the wafer stage, the set of flexures being substantially aligned in a plane with the wafer, and at least one actuator to stabilize the wafer table when the wafer stage is being accelerated. The wafer stage device further comprises a first feedforward controller to control a stabilizing output of the at least one actuator.

A seventh aspect of the present invention is a wafer stage control system for stabilizing a wafer table in a wafer manufacturing process. The wafer table supports a wafer, and a wafer stage is being subject to acceleration in response to a wafer manufacturing control system to position the wafer table. The wafer stage control system comprises at least one flexure substantially aligned in a plane with the wafer and connecting the wafer table to the wafer stage, and at least one actuator mounted on the wafer stage to generate an output to stabilize the wafer table when the wafer stage is being accelerated. The wafer stage control system also comprises a first feedforward control system to control the output of the at least one actuator by determining a stabilizing force to be exerted on the wafer table to counteract a rotational motion of the wafer table caused by an acceleration of the wafer stage.

A further aspect of the present invention is a lithography system comprising an illumination system that irradiates radiant energy and a wafer stage device that carries an object, such as a wafer, disposed on a path of the radiant energy. The lithography system may also comprise a wafer stage control system connected to the wafer stage device.

It is to be understood that both the foregoing general description and the following detailed description are exemplary and explanatory only and are not restrictive of the invention as claimed. Additional advantages will be set forth in the description which follows, and in part will be understood from the description, or may be learned by practice of the invention. The advantages and purposes may be obtained by means of the combinations set forth in the attached claims.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

DESCRIPTION OF THE INVENTION

Reference will now be made in detail to several embodiments of device, system, and method consistent with the principles of the present invention, examples of which are illustrated in the accompanying drawings. The invention will be further clarified by the following examples, which are intended to be exemplary of the invention.

A wafer stage device and control system consistent with the principles of this invention are useful to stabilize a wafer stage and a wafer table in a photolithography system to manufacture semiconductor wafers. The wafer table supports the wafer, while the wafer stage positions the wafer as it is being accelerated in response to a wafer manufacturing control system. The principles of this invention are similarly applicable in a reticle stage device and control system. Thus, this invention is not limited to any particular application. Rather, the device, system, and method disclosed herein could be used in any system configured to embody similar elements disclosed which require stabilization as the system is being accelerated.

Figure 1:
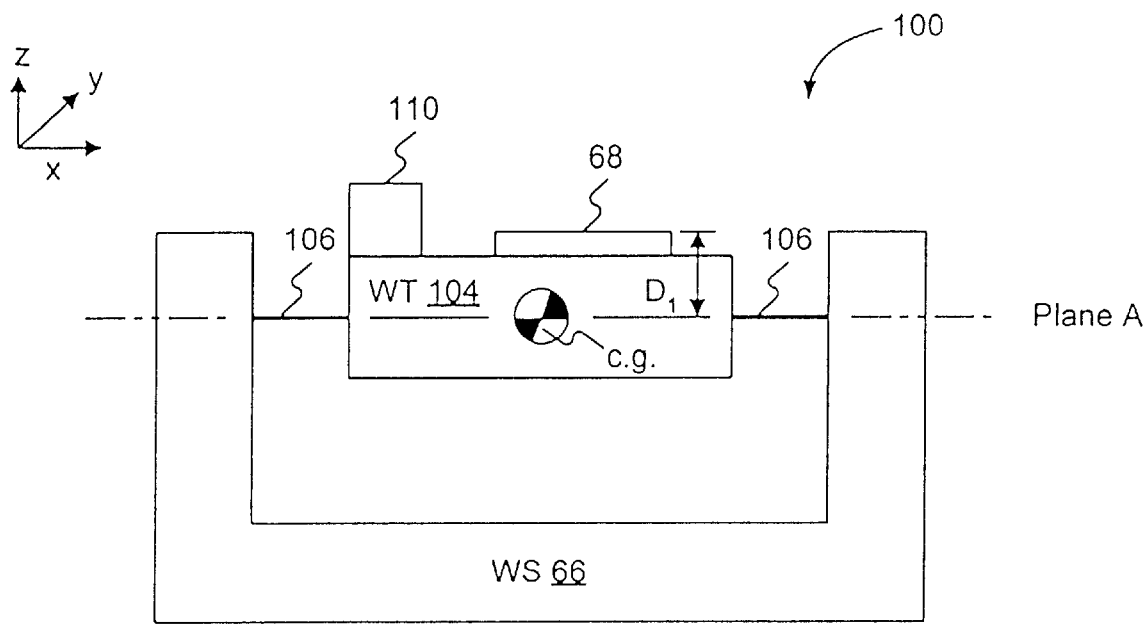
FIG. 1 is an elevation view of a conventional wafer stage device.
Figure 2:
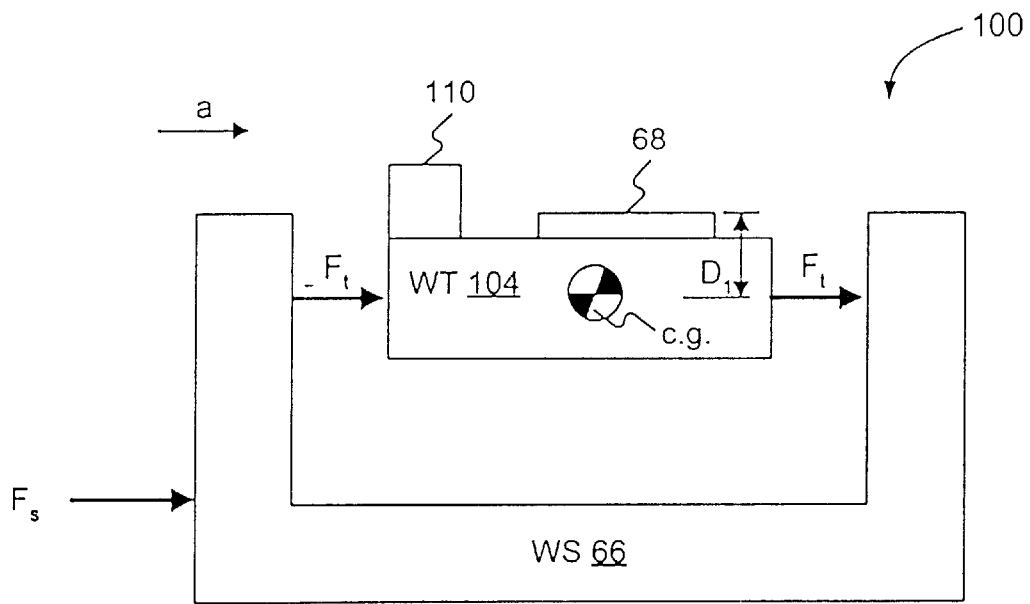
FIG. 2 is a diagram of forces acting on the wafer stage and the wafer table of the conventional wafer stage device.
Figure 3:
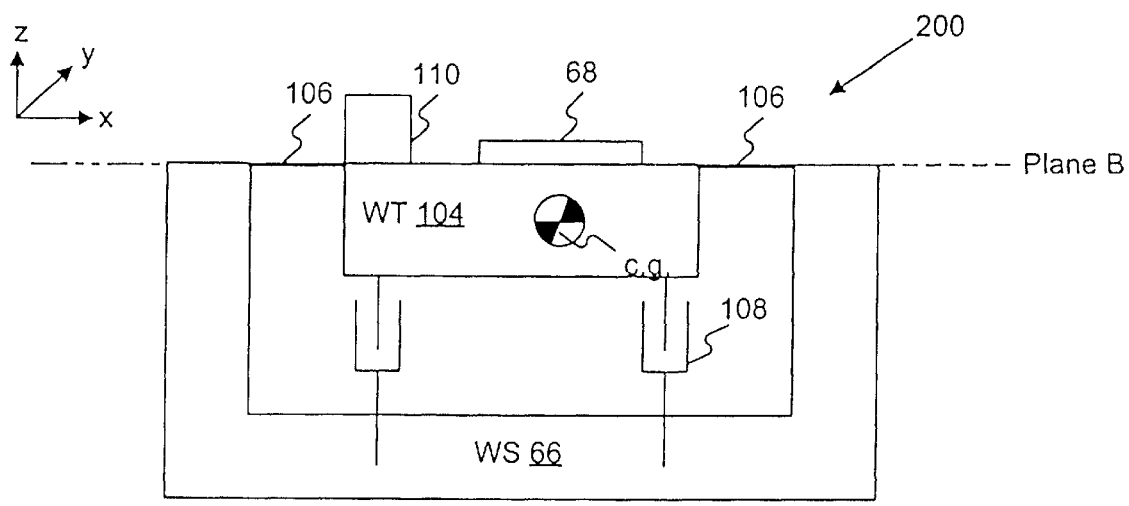
FIG. 3 is an elevation view of a wafer stage device consistent with the principles of the present invention.

Consistent with the principles of the present invention as illustrated in FIG. 3, a wafer stage device 200 is provided for manufacturing semiconductor wafers. Wafer stage device 200 includes a wafer stage 66, a wafer table 104, and a set of flexures 106 attached to wafer stage 66 to support wafer table 104. If viewed downward along the z axis, wafer stage 66 and wafer table 104 may have a circular configuration, substantially concentrically arranged, and a plurality of flexures 106 being distributed around the concentric configuration connecting wafer table 104 to wafer stage 66.

Figure 7:
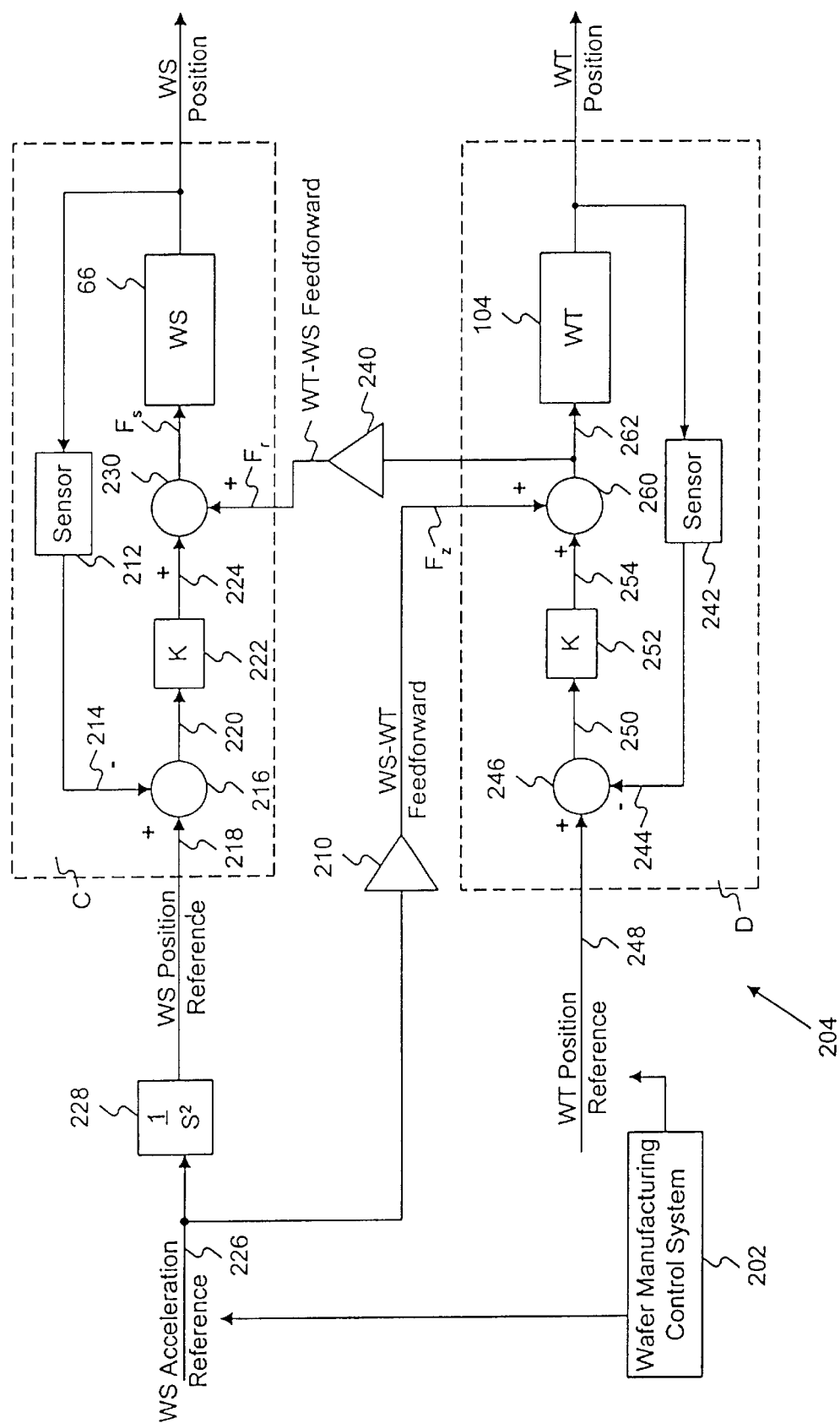
FIG. 7 is a block diagram of a control system for operating the wafer stage device consistent with the principles of the present invention.

Wafer stage 66 functions to position a semiconductor wafer 68 as wafer stage 66 is being accelerated in response to a wafer manufacturing control system 202 (shown in FIG. 7). Wafer table 104 functions to support wafer 68 and to account for or correct any irregularity on the surface of wafer 68. Wafer table 104 has a predetermined center of gravity (c.g.). Consistent with the principles of the present invention, flexures 106 are positioned in a plane B that is substantially in alignment with wafer 68 to substantially reduce the leveling shift problem, such as previously discussed with respect to the conventional wafer stage device 100. Generally, plane B rests parallel to the x-y plane. Thus, flexures 106 are above the c.g. of wafer table 104 by a distance of $D_3$ along the z axis.

Figure 4:
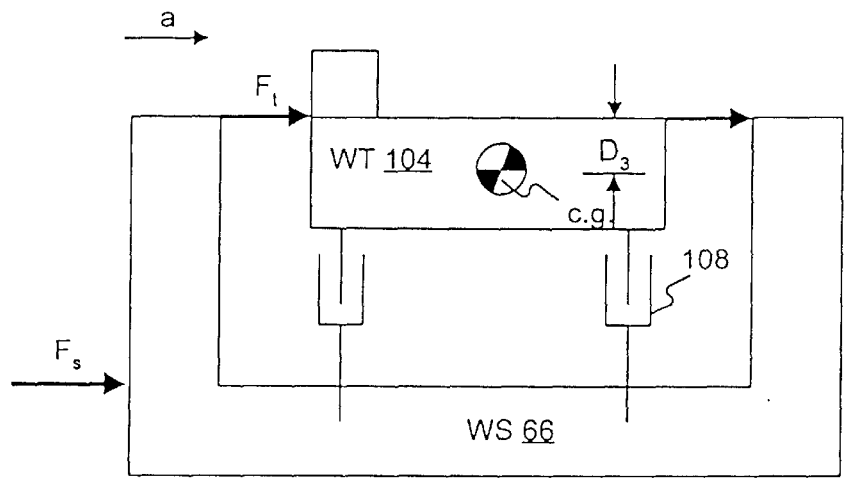
FIG. 4 is a diagram of forces acting on the wafer stage and the wafer table consistent with the principles of the present invention.

FIG. 4 illustrates an acceleration a imparted to wafer stage device 200 by applied force $F_s$ on wafer stage 66. Subsequently, flexures 106 apply a force $F_t$ onto wafer table 104. Wafer manufacturing control system 202 (shown in FIG. 7 and 8), incorporating inputs from a wafer interferometer 112 and a wafer moving mirror 110, determines the amount of force $F_s$ which is proportionate to what the acceleration a is desired to be, according to the formula of:

$$F_s = M_s \cdot a$$

whereby, $M_s$ is the overall mass of wafer stage device 200. Alternatively, wafer manufacturing control system 202 may also incorporate inputs from a reticle interferometer 118 and a reticle moving mirror 116 to determine the amount of Force $F_s$.

Wafer table force $F_t$ is proportional to wafer stage force $F_s$ according to the ratio of the mass of wafer table 104 to the overall mass of wafer stage device 200 ($M_s$). The mathematical relations of wafer stage force $F_s$ and wafer table force $F_t$ can be expressed as follows:

$$F_t / F_s = M_{WT} / M_s;$$

$$= M_{WT} / (M_{WS} + M_{WT})$$

whereby $M_{WT}$ represents the mass of wafer table 104 and all parts rigidly connected to it, $M_{WS}$ represents the mass of wafer stage 66 and all parts rigidly connected to it, and $M_s$ represents the overall mass of wafer stage device 200. So, for example, if $M_{WS}$ and $M_{WT}$ are equal, i.e., the overall mass approximately equals to twice of the mass of wafer table, then:

$$F_t / F_s \approx M_{WT} / (2 \times M_{WT})$$

$$F_t / F_s \approx \frac{1}{2}$$

Flexures 106 restrain shifting motion of wafer table 104 along the x and y axes around plane B, and allow wafer table 104 to move along the z axis normal to plane B. In one embodiment, the set of flexures 106 may be a combination three or more flexures 106, made of steel or other suitable material, shaped as a rectangular plate, each being arranged in a circle approximately equilaterally positioned from each other around wafer table 104, one side of the plates attached to wafer stage 66 while the other side of the plates attached to wafer table 104.

Also consistent with the principles of the present invention, wafer stage device 200 includes at least one actuator 108 to stabilize wafer table 104 with respect to wafer stage 66 when wafer stage device 200 is being accelerated. Actuators 108 may be voice-coil motors type of actuators (VCM), an electro-magnetic type actuator such as a motor, an EI core actuator, or equivalents. An EI core actuator is an electromagnetic transducer which obtains its name because its shape resembles the letters "E" and "I", whereby magnetic fields circulate around the three legs of the E-core to exert force on the I-core.

FIG. 4 illustrates acceleration a along the x axis created by wafer stage force $F_s$ onto wafer stage 66 and wafer table force $F_t$ along plane B onto wafer table 104 via flexures 106. Wafer table force $F_t$, being above the c.g. by a distance $D_3$ along the z axis, creates a rotational moment on wafer table 104 around the c.g. which leads to pitching and rolling errors for wafer table 104. When wafer stage 66 moves in one direction, for example, along the x axis, a pitching error occurs if wafer table 104 rotates around the y axis, and a rolling error occurs if wafer table 104 around the x axis. In some instances, the pitching and rolling errors may be as large as 1000 micro-radians.

Figure 5:
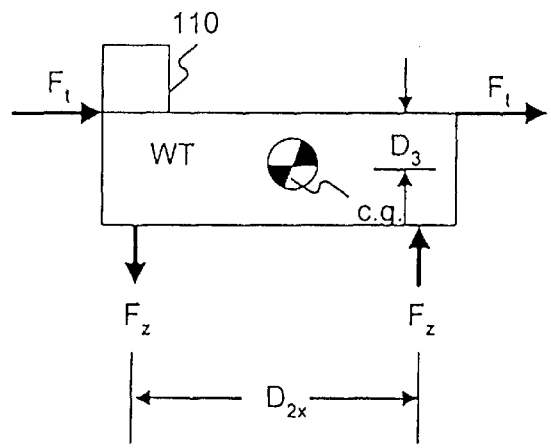
FIG. 5 is a diagram of forces acting on the wafer table consistent with the principles of the present invention.

In a sensitive application, such as a photolithography system, this type and magnitude of errors need to be eliminated or substantially minimized. FIG. 5 illustrates a couple of stabilizing force $F_z$ exerted by actuators 108 onto wafer table 104 to control the pitching and rolling motions of wafer table 104.

FIGS. 3–5 illustrate a pair of actuators 108, separated by a predetermined distance $D_{2x}$ along the x axis, exerting a stabilizing force $F_z$ or torque $T_{\theta y}$ (not shown) onto wafer table 104 to control pitching motion of wafer table 104 around the y axis with respect to wafer stage 66. Wafer stage device 200 may include another actuator 108 (not shown), separated from the others by a predetermined distance $D_{2y}$ (not shown) along the y axis, exerting stabilizing force $F_z$ or torque $T_{\theta x}$ (not shown) onto wafer table 104 to control rolling motion of wafer table 104 around the x axis with respect to wafer stage 66.

A control system 204, illustrated in FIG. 7, is provided to determine stabilizing force $F_z$ or torques $T_{\theta x}$ and $T_{\theta y}$. Without control system 204, wafer stage device 200 shown in FIGS. 3–5 may experience the pitching and rolling errors.

Figure 6A:
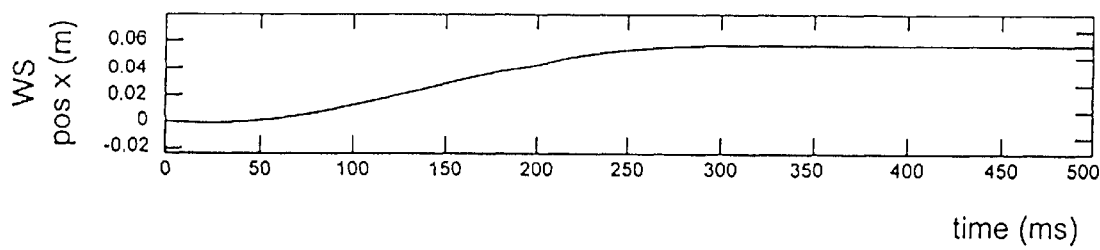
FIGS. 6A and 6B are charts of wafer stage position along the x and y axes generated according to a simulation performed on the wafer stage device of FIGS. 3–5.
Figure 6B:
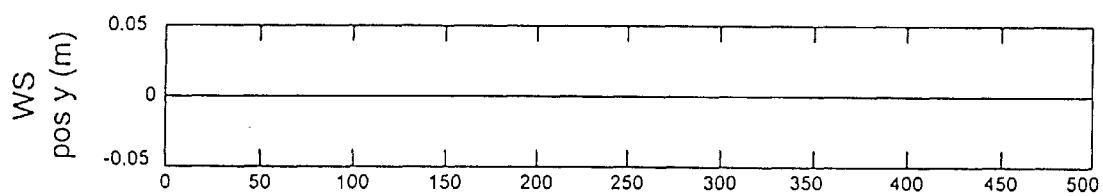
Figure 6C:
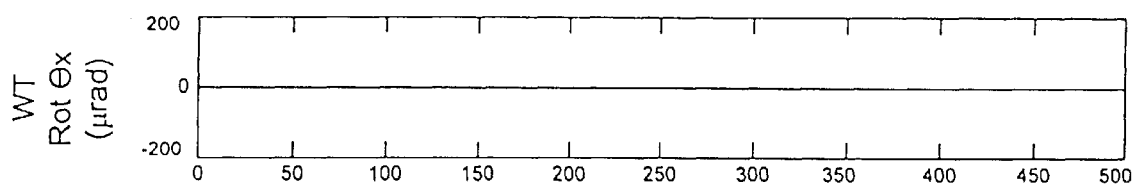
FIGS. 6C and 6D are charts of wafer table pitching and rolling motions around the x and y axes generated according to a simulation performed on the wafer stage device of FIGS. 3–5.
Figure 6D:
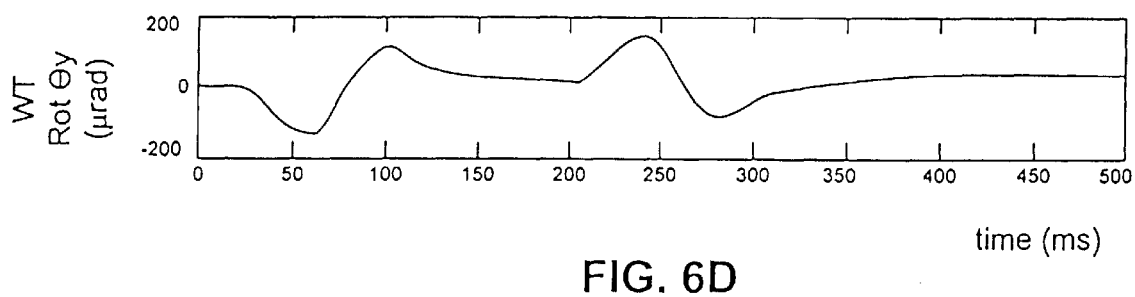

FIGS. 6A–6D show the results of a simulation of wafer stage device 200 without control system 204 when wafer stage 66 is moved 0.05 m (50 mm) along the x axis. FIGS. 6A and 6B represent the position of wafer stage 66 along the x and y axes, respectively, measured in meters (m) over a period of time in milli-seconds (ms). FIGS. 6C and 6D represent the rolling and pitching motion of wafer table 104 around the x and y axes, respectively, measured in micro-radians ($\mu$rad) over a period of time in milli-seconds (ms). When wafer table 66 is moved 50 mm along the x axis, between time 0–25 ms, wafer table 104 is reasonably steady; between time 25–100 ms, it pitches around the y axis when wafer table 66 is accelerated; between time 100–200 ms, it is almost steady again; and between time 200–350 ms, it pitches again around the y axis when wafer stage 66 is decelerated. It can be seen that, wafer table 104 will experience similar rolling motion around the x axis when wafer stage 66 is moved along the y axis. Such rolling and pitching motion cause instability reducing accuracy in the wafer manufacturing process.

Therefore, consistent with the principles of the present invention, FIG. 7 illustrates a block diagram of control system 204 which includes a first feedforward control system 210 connected to a wafer stage acceleration reference 226 to calculate stabilizing torques $T_{\theta x}$ and $T_{\theta y}$ around the x and y axes, respectively, which in turn determine stabilizing force $F_z$. Stabilizing force $F_z$ is the force that actuators 108 exert on wafer table 104 along the z axis direction to counteract a rotational motion, i.e., pitching and rolling, of wafer table 104 caused by acceleration of wafer stage 66. First feedforward control system 210 uses a signal from wafer stage acceleration reference 226 representing the desired acceleration of wafer stage 66 to determine stabilizing torques $T_{\Theta x}$ and $T_{\Theta y}$ according to the following matrix:

$$\begin{Bmatrix} T_{\theta x} \\ T_{\theta y} \end{Bmatrix} = M_{WT} \begin{bmatrix} 0 & D_3 \\ -D_3 & 0 \end{bmatrix} \begin{Bmatrix} a_x \\ a_y \end{Bmatrix}$$

whereby $M_{WT}$ is the mass of wafer table 104 and all parts rigidly connected to it, $D_3$ is the distance along the z axis between c.g. of wafer table 104 and flexures 106, $a_x$ and $a_y$ are the desired acceleration of wafer stage 66 along the x and y axes, respectively. The outputs of the above matrix are the stabilizing torques $T_{\Theta x}$ and $T_{\Theta y}$ to counteract the pitching and rolling motions of wafer table 104 caused by acceleration $a_x$ and $a_y$ of wafer stage 66 along the x and y axes.

A subsequent coordinate transformation, based on distances $D_{2x}$ and $D_{2y}$ between actuators 108 along the x and y axes, respectively, can determine the stabilizing force $F_z$ necessary to apply to each of actuators 108 to produce torques $T_{\Theta x}$ and $T_{\Theta y}$ according to the following equations:

$T_{\Theta x} = F_z \cdot D_{2x}$; and $T_{\Theta y} = F_z \cdot D_{2y}$

In addition, control system 204 may also include a second feedforward control system 240 connected between wafer stage 66 and wafer table 104 to stabilize wafer stage 66 from a relative motion between wafer stage 66 and wafer table 104. Second feedforward control system 240 determines a correction force $F_r$ to be exerted on wafer stage 66 to counteract a leveling shift of wafer table 104 due to a rotation of wafer table 104 driven by actuators 108.

In the photolithography field, first feedforward control system 210 is generally referred to as a wafer stage to wafer table (WS-WT) feedforward control system, and second feedforward control system 240 is generally referred to as a wafer table to wafer stage (WT-WS) feedforward control system.

As illustrated in the block diagram of FIG. 7, a wafer stage control loop C is created to correct a wafer stage position error. Within control loop C, a wafer stage position sensor 212 is provided to determine a wafer stage position signal 214 representing the actual position of wafer stage 66. Position sensor 212 determines the actual position of wafer stage 66 along the x and y axes, and the rotation around the z axis, $\Theta z$. In this case, wafer stage position sensor 212 corresponds to a wafer interferometer 112 and a wafer moving mirror 110 shown in FIG. 8.

Figure 10:
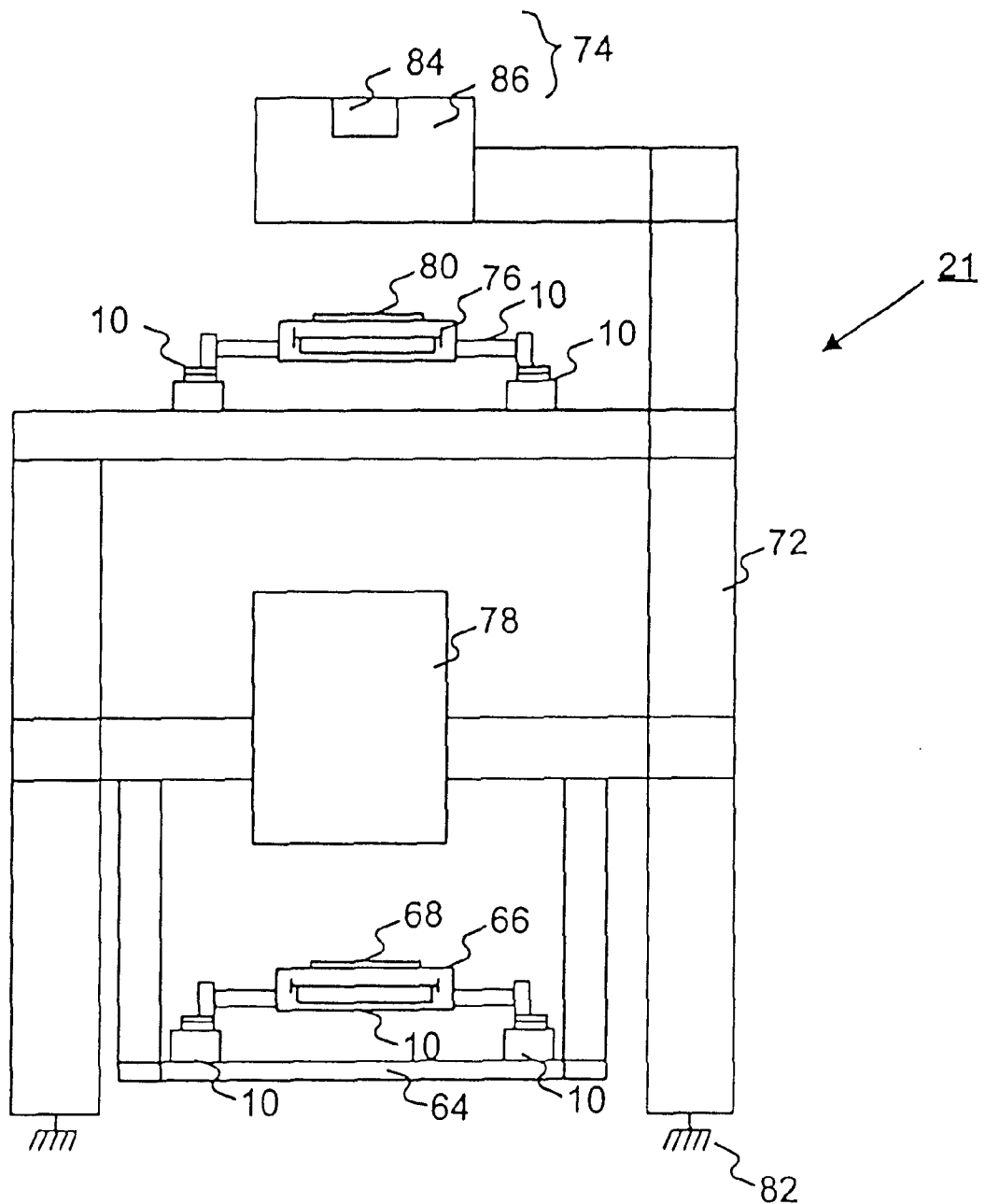
FIG. 10 is an elevation view of an exposure apparatus utilizing the wafer stage device and control system having features of the present invention.

A summing junction 216 compares wafer stage position signal 214 with a wafer stage position reference 218 to determine a wafer stage position error 220. Wafer stage position reference 218 represents a calculated or desired position of wafer stage 66. In response to wafer stage position error 220, a controller 222 generates a calculated wafer stage force 224 (using motor 10 shown in FIGS. 8 and 10) to be applied to wafer stage 66 to correct the position error of wafer stage 66.

A wafer stage acceleration reference 226 is provided to determine wafer stage position reference 218. Acceleration reference 226 may be a preset input or an output of a controller (not shown), or may also be generated by wafer manufacturing control system 202. Acceleration reference 226 is mathematically integrated twice by an integrator 228, the first integration generating a velocity reference, which is an internal calculation, hence not shown, and the second integration generating position reference 218. Thus, wafer stage force 224 is the calculated force to apply to wafer stage 66 to counteract the position error of wafer stage 66 based on the actual position measured by position sensor 212 and the desired position determined by wafer stage acceleration reference 226.

Similarly, a wafer table control loop D is created to correct a wafer table position error. Within control loop D, a wafer table position sensor 242 is provided to determine a wafer table position signal 244 representing the actual position of wafer table 104. Position sensor 242 determines the actual position of wafer table 104 along the z axis, and the rotations around the x and y axes, $\Theta x$ and $\Theta y$, respectively. In this case, wafer table position sensor 242 corresponds to a wafer interferometer 112 and auto-focus (AF) sensors 19 and 20 shown in FIG. 8.

A summing junction 246 compares wafer table position signal 244 with a wafer table position reference 248 to determine a wafer table position error 250. In response to wafer table position error 250, a controller 252 generates a wafer table force 254 to be applied to wafer table 104 to correct the position error of wafer table 104. Wafer table position reference 248 may be a preset input or an output of a controller (not shown), or may also be generated by wafer manufacturing control system 202. Thus, wafer table force 254 is the calculated force to apply to wafer table 104 to counteract the position error of wafer table 104 based on the actual position measured by position sensor 242 and the desired position determined by wafer table position reference 248.

Also illustrated in FIG. 7, wafer stage acceleration reference signal 226 is inputted to wafer table loop D, via first feedforward control system 210, to determine stabilizing force $F_z$ or torques $T_{\Theta x}$ and $T_{\Theta y}$, as previously discussed, to be exerted by actuators 108 onto wafer table 104 to counteract the rotational motion of wafer table 104 caused by acceleration of wafer stage 66. Wafer table force $F_t$ is an internal calculation done within first feedforward control system 210. Summing junction 260 combines stabilizing force $F_z$, or torques $T_{\Theta x}$ and $T_{\Theta y}$, and force 254, and generates a total force 262 to be exerted on wafer table 104 to stabilize wafer table 104 due to both the rotational motion and the wafer table position error.

Further illustrated in FIG. 7, second feedforward control system 240 connected between wafer table loop D and wafer stage loop C determines correction force $F_r$ to be exerted on wafer stage 66 to counteract a leveling shift of wafer table 104 due to the rotation of wafer table 104 as exerted by actuators 108. Summing junction 230 combines reaction force $F_r$ and force 224, and generates wafer stage force $F_s$ to be exerted on wafer stage 66 (motor 10 shown in FIGS. 8 and 10) to accelerate along x or y axis direction and stabilize wafer stage 66 to correct both the wafer stage position error and leveling shift caused by rotation of wafer table 104.

Figure 8:
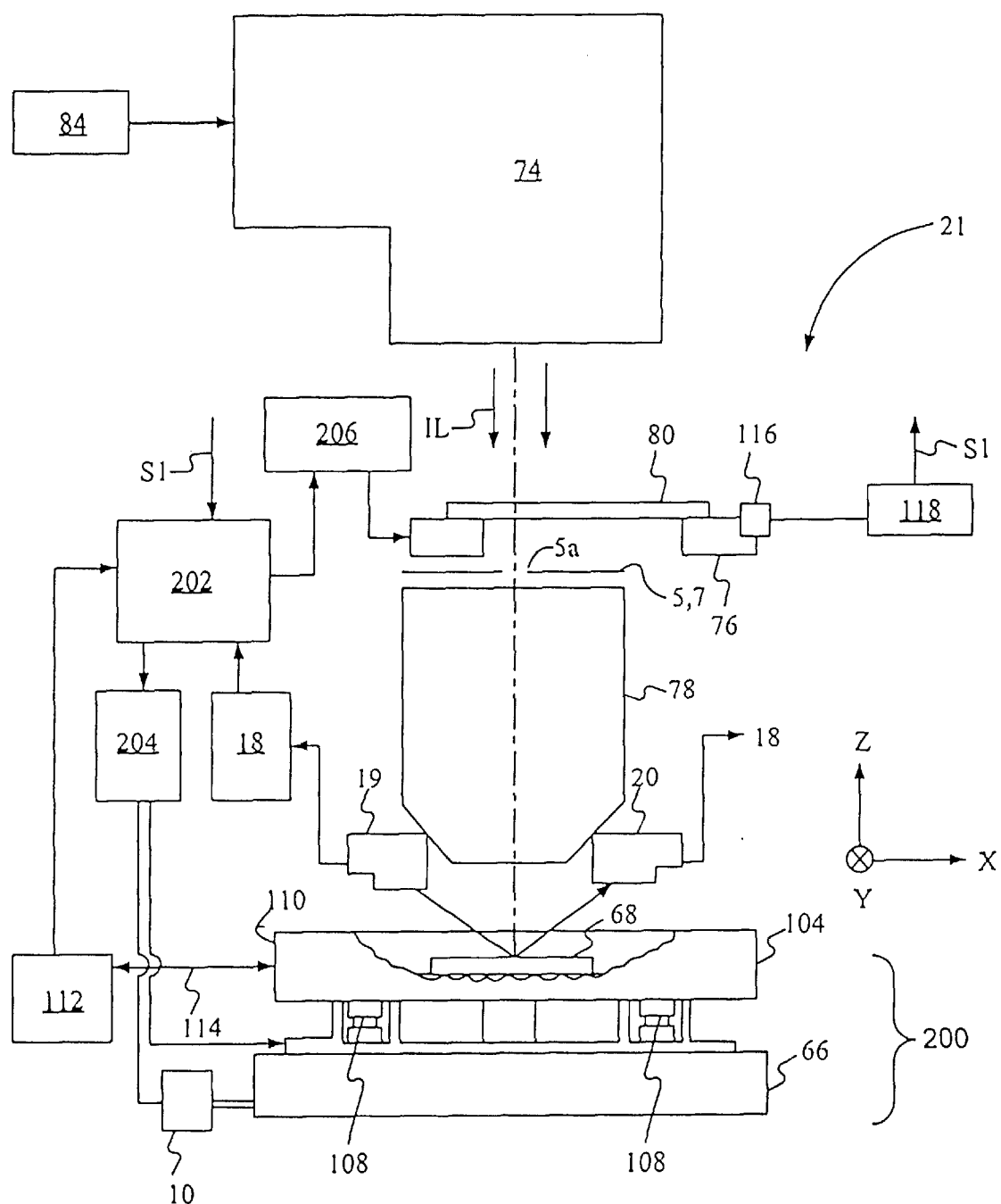
FIG. 8 is a block diagram of an exposure apparatus consistent with the principles of the present invention.

As illustrated in FIG. 8, wafer stage position sensor 212 and wafer table position sensor 242 (shown in FIG. 7) may be integrally constructed by providing wafer moving mirror 110 on wafer table 104 to reflect light, such as laser beam, transmitted from wafer interferometer 112. Based on the reflected light, for control loop C, wafer interferometer 112 then determines the actual position of wafer stage 66 along the x and y axes, and the rotation around the z axis, $\Theta z$. In some cases, reticle interferometer 118 and reticle moving mirror 116 may be integrally constructed in addition to wafer interferometer 112 and wafer moving mirror 110. For control loop D, auto-focus (AF) sensors 19 and 20 and a calculator 18 determine the actual position of wafer table 104 along the z axis and wafer interferometer 112 determines the rotation around the x and y axes, Θx and Θy, respectively. Therefore, all six degrees of free of wafer stage 66 are accounted for. Alternatively, interferometer 112 may be substituted with other positional sensors, such as, an encoder, or equivalents.

FIG. 8 illustrates a configuration where an interferometer laser beam 114 lays on the same horizontal plane as wafer 68. For a configuration where interferometer laser beam 114 does not lay on the same horizontal plane as wafer 68, wafer interferometer 112 can be set up to also measure pitch and roll of wafer table 104 to compensate for measurement errors along the x and y axes.

Also shown in FIG. 8, a reticle moving mirror 116 is provided on reticle stage 76 to reflect light, such as laser beam, transmitted by a reticle interferometer 118. Reticle interferometer 118 determines the actual position of reticle stage 76. A reticle stage position signal S1 is then generated and fed to wafer manufacturing control system 202. Wafer manufacturing control system 202 generates an output for a reticle stage control system 206 to correct and control the motion of reticle stage 76.

Figure 9A:
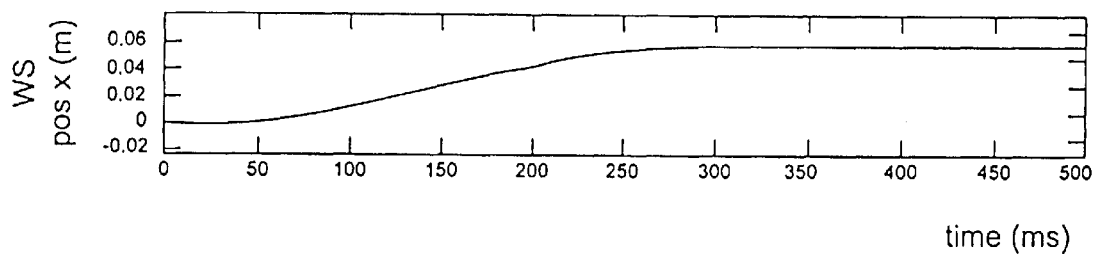
FIGS. 9A and 9B are charts of wafer stage position along the x and y axes generated according to a simulation performed on the wafer stage device of FIGS. 3–5 with the control system of FIG. 7.
Figure 9B:
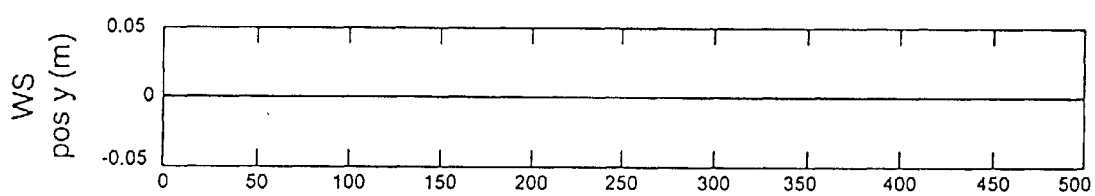
Figure 9C:
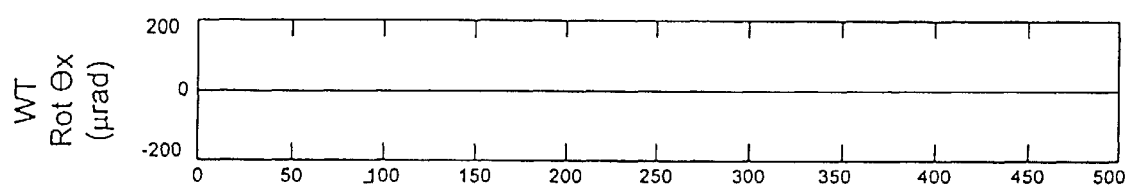
FIGS. 9C and 9D are charts of wafer table pitching and rolling motions around the x and y axes generated according to a simulation performed on the wafer stage device of FIGS. 3–5 with the control system of FIG. 7.
Figure 9D:
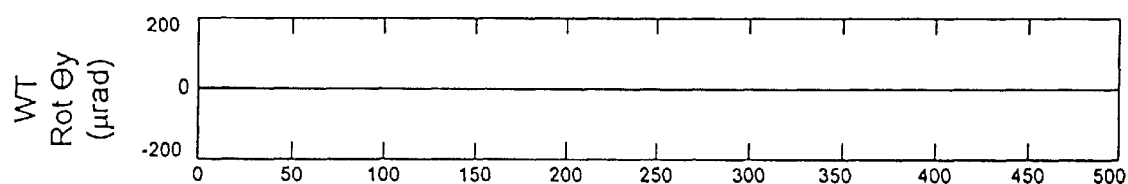

Similar to FIGS. 6A–6D, FIGS. 9A–9D show the results of a simulation of stage device 200 operated with control system 204 consistent with the principles of the present invention when wafer stage 66 is moved 0.05 m (50 mm) along the x axis. FIGS. 9A and 9B represent the position of wafer stage 66 along the x and y axes, respectively, measured in meters (m) over a period of time in milli-seconds (ms). FIGS. 9C and 9D represent the rolling and pitching motions of wafer table 104 around the x and y axes, respectively, measured in micro-radians ($\mu$rad) over a period of time in milli-seconds (ms). FIG. 9D shows that, wafer stage device 200 utilizing control system 204 consistent with the principles of the present invention substantially eliminate the Θy error of wafer table 104 when wafer stage 66 is moved along the x axis. It can be seen that, Θx error of wafer table 104 will also be substantially eliminated when wafer stage 66 is moved along the y axis.

Wafer stage device 200 and control system 204 are particularly useful in combination with an exposure apparatus 21 in a photolithography process. In operation, exposure apparatus 21, shown in FIGS. 8 and 10, transfers a pattern of an integrated circuit from reticle 80 onto semiconductor wafer 68. Exposure apparatus 21 mounts to a base 82, i.e., a floor or the ground or some other supporting structure.

Apparatus frame 72 is rigid and supports the components of exposure apparatus 21. The design of apparatus frame 72 may vary to suit the design requirements for the rest of exposure apparatus 21. Apparatus frame 72 supports reticle stage 76, wafer stage 66, lens assembly 78, and illumination system 74 above base 82. Alternatively, for example, separate, individual structures (not shown) can be used to support wafer stage 66 and reticle stage 76, illumination system 74, and lens assembly 78 above base 82.

Apparatus frame has a wafer stage base 64 that supports wafer stage 66 movably thereon. Illumination system 74 includes an illumination source 84 and an illumination optical assembly 86. Illumination source 84 emits the beam (irradiation) of light energy. Illumination optical assembly 86 guides the beam of light energy from illumination source 84 to lens assembly 78. The beam illuminates selectively different portions of reticle 80 and exposes wafer 68. In FIG. 9, illumination source 84 is illustrated as being supported above reticle stage 76. Typically, however, illumination source 84 is secured to one of the sides of apparatus frame 72 and the energy beam from illumination source 84 is directed to above reticle stage 76 with illumination optical assembly 86.

Lens assembly 78 projects and/or focuses the light passing through reticle 80 to wafer 68. Depending upon the design of apparatus 21, lens assembly 78 can magnify or reduce the image illuminated on reticle 80. Lens assembly 78 can also be a 1× magnification system.

Wafer stage device 200 and control system 204 consistent with the principles of the present invention stabilize wafer stage 66 and wafer table 104 so that the leveling shift problem and the rotational problem are substantially reduced as previously discussed in detail. The principles of the present invention also apply to reticle stage 76 in positioning reticle 80.

Reticle stage 76 holds and precisely positions reticle 80 relative to lens assembly 78 and wafer 68. A slit-like opening 5a is formed in a field stop 5 disposed in a vicinity of a movable blind 7. The light passed through field stop 5 becomes a light flux having a cross section mirroring slit-like opening 5a and enters lens assembly 78.

Similar to reticla stage 76, wafer stage 66 holds and positions wafer 68 with respect to the projected image of the illuminated portions of reticle 80. In the embodiment illustrated in FIG. 10, wafer stage 66 and reticle stage 76 are positioned by a plurality of motors 10. Depending upon the design, apparatus 21 can also include additional servo drive units, linear motors and planar motors to move wafer stage 66 and reticle stage 76. Wafer stage 66 can be constructed with a coarse mover (not shown) and a fine mover (also not shown). The coarse mover is also known as a coarse stage, while the fine mover as a fine stage. The coarse mover includes a linear motor as a first driving unit and moves the fine mover and wafer table 104 in the x and y directions in long stroke. The fine mover includes an EI core actuator or voice coil motor as a second driving unit to adjust the position of wafer table 104 relative to the coarse mover (wafer stage 66) precisely in the x and y directions. In this design, second feedforward control system 240 is used to control the second driving unit to determine correction force to be exerted on the fine mover to counteract a leveling shift of wafer table 104 due to the rotation on wafer table 104 as exerted by actuators 108. Further, wafer table 104 can have six degrees of freedom relative to wafer stage 66 by utilizing the second driving unit and actuators 108.

There are a number of different types of photolithographic devices. For example, exposure apparatus 21 can be used as a scanning type photolithography system which exposes the pattern from reticle 80 onto wafer 68 with reticle 80 and wafer 68 moving synchronously. In a scanning type lithographic device, reticle 80 is moved perpendicular to an optical axis of lens assembly 78 by reticle stage 76 and wafer 68 is moved perpendicular to an optical axis of lens assembly 78 by wafer stage 66. Scanning of reticle 80 and wafer 68 occurs while reticle 80 and wafer 68 are moving synchronously.

Alternately, exposure apparatus 21 can be a step-and-repeat type photolithography system that exposes reticle 80 while reticle 80 and wafer 68 are stationary. In the step and repeat process, wafer 68 is in a constant position relative to reticle 80 and lens assembly 78 during the exposure of an individual field. Subsequently, between consecutive exposure steps, wafer 68 is consecutively moved by wafer stage 66 perpendicular to the optical axis of lens assembly 78 so that the next field of semiconductor wafer 68 is brought into position relative to lens assembly 78 and reticle 80 for exposure. Following this process, the images on reticle 80 are sequentially exposed onto the fields of wafer 68 so that the next field of semiconductor wafer 68 is brought into position relative to lens assembly 78 and reticle 80.

However, the use of exposure apparatus 21 provided herein is not limited to a photolithography system for a semiconductor manufacturing. Exposure apparatus 21, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

The illumination source 84 can be g-line (436 nm), i-line (365 nm), KrF excimer laser (248 nm), ArF excimer laser (193 nm) and $F_2$ laser (157 nm). Alternatively, illumination source 84 can also use charged particle beams such as x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

With respect to lens assembly 78, when far ultra-violet rays such as the excimer laser is used, glass materials such as quartz and fluorite that transmit far ultra-violet rays is preferably used. When the $F_2$ type laser or x-ray is used, lens assembly 78 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as wall as Japan Patent Application Disclosure No. 10-3039 and its counterpart U.S. patent application Ser. No. 873,606 (Application Date: Jun. 12, 1997) also use a reflecting-refracting type of optical system incorporating a concave mirror, etc., but without a beam splitter, and can also be employed with this invention. The disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 11:
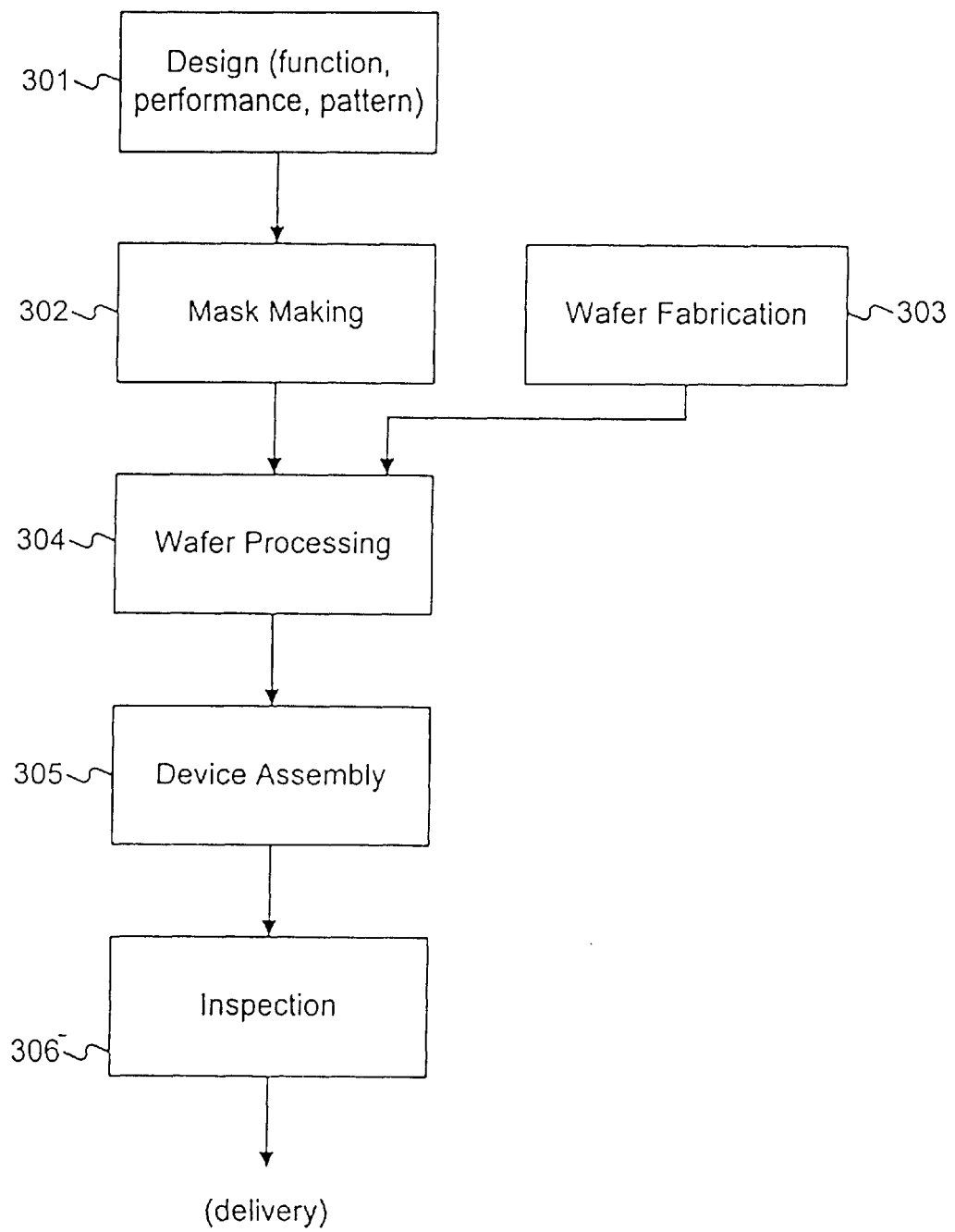
FIG. 11 is a flow chart outlining a process for manufacturing a semiconductor wafer in accordance with the present invention.

Further, semiconductor devices can be fabricated using the above described systems, by the process shown generally in FIG. 11. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system described hereinabove consistent with the principles of the present invention. In step 305 the semiconductor device is assembled (including the dicing process, bonding process and packaging process), then finally the device is inspected in step 306.

Figure 12:
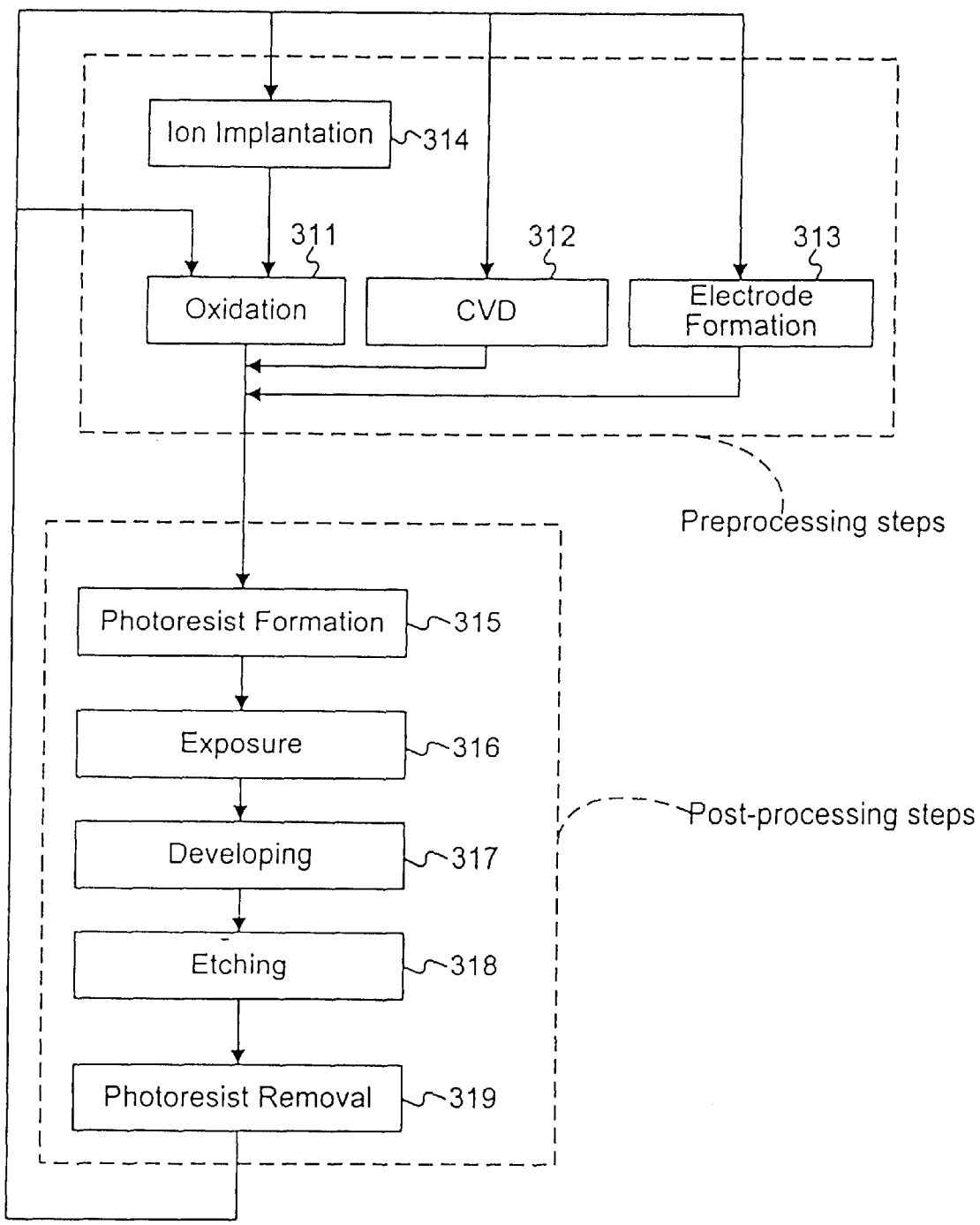
FIG. 12 is a flow chart outlining a wafer manufacturing process in further detail.

FIG. 12 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted In the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

It will be apparent to those skilled in the art that various modifications and variations can be made in the methods described, in the stage device, the control system, the material chosen for the present invention, and in construction of the photolithography systems as well as other aspects of the invention without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

We claim:

1. A wafer stage control system, comprising:
    a first feedforward control system to determine a stabilizing force to be exerted onto a wafer table to counteract a rotational motion of the wafer table caused by an acceleration of a wafer stage; and
    a second feedforward control system to determine a correction force to be exerted on the wafer stage to correct a leveling shift caused by a rotation of the wafer table.

2. The wafer stage control system of claim 1, further comprising:
    a wafer stage control loop to determine a wafer stage position error and to generate a wafer stage force to be exerted on the wafer stage to correct the wafer stage position error.

3. The wafer stage control system of claim 2, wherein the wafer stage control loop comprises:
    a wafer stage position sensor to measure an actual position of the wafer stage;
    a summing junction to compare the actual position and a position reference of the wafer stage to generate a wafer stage position error signal; and
    a controller to determine the wafer stage force based on the wafer stage position error signal.

4. The wafer stage control system of claim 2, wherein the wafer stage control loop further comprises:
    a wafer stage acceleration reference to determine the wafer stage position reference.

5. The wafer stage control system of claim 1, further comprising:
    a wafer table control loop to determine a wafer table position error and to generate a wafer table force to be exerted onto the wafer table to correct a wafer table position error.

6. The wafer stage control system of claim 5, wherein the wafer table control loop comprises:
    a wafer table position sensor to measure an actual position of the wafer table;
    a summing junction to compare the actual position and a position reference of the wafer table to generate a wafer table position error signal; and
    a controller to determine the wafer table force based on the wafer table position error signal.

7. A method for operating a wafer stage and wafer table control system, comprising the steps of:
    determining a stabilizing force to be exerted on a wafer table to counteract a rotational motion of the wafer table caused by an acceleration of a wafer stage; and
    determining a force to be exerted on the wafer stage to counteract a leveling shift of the wafer table due to a rotation of the wafer table.

8. The method of claim 7, further comprising the steps of:
    determining a wafer stage position error based on an actual position and a reference position of the wafer stage; and
    generating a wafer stage force to be exerted on the wafer stage to correct the wafer stage position error.

9. The method of claim 7, further comprising the steps of:
    determining a wafer table position error based on an actual position and a reference position of the wafer table; and
    generating a wafer table force to be exerted on the wafer table to correct the wafer table position error.

10. A method for operating a wafer stage and wafer table control system, comprising the steps of:
    creating a wafer stage loop to correct a wafer stage position error, a wafer stage acceleration reference signal being an input to the wafer stage loop;
    creating a wafer table loop to correct a wafer table position error;
    inputting the wafer stage acceleration reference signal to the wafer table loop to determine a stabilizing force to be exerted onto the wafer table to counteract a rotational motion of the wafer table caused by an acceleration of the wafer stage; and
    determining a force to be exerted on the wafer stage to correct a leveling shift of the wafer table due to a rotation of the wafer table.

11. The method of claim 10, wherein the step of creating a wafer stage loop further comprises:
    comparing a wafer stage actual position with a wafer stage position reference to generate a wafer stage position error signal; and
    calculating a wafer stage force signal corresponding to the wafer stage position error signal to correct the wafer stage position error.

12. The method of claim 10, wherein the step of creating a wafer table loop further comprises:
    comparing a wafer table actual position with a wafer table position reference to generate a wafer table position error signal; and
    calculating a wafer table force signal corresponding to the wafer table position error signal to correct the wafer stage position error.

13. A method for stabilizing a wafer table in a wafer manufacturing apparatus, the wafer table supporting a wafer, the wafer stage being subject to acceleration in response to a wafer manufacturing control system to position the wafer table, the method comprising the steps of:

generating a wafer stage force to be exerted onto a wafer stage to correct a position error of the wafer stage;

generating a wafer table force to be exerted onto a wafer table to correct a position error of the wafer table;

generating a stabilizing force to be exerted onto the wafer table to counteract a rotational motion of the wafer table caused by acceleration of the wafer stage; and generating a correction force to be exerted onto the wafer stage to compensate leveling shift of the wafer table.

14. The method of claim 13, wherein the step of generating a wafer stage force further comprises:

comparing an wafer stage actual position with a wafer stage position reference to determine a wafer stage position error; and calculating the wafer stage force based on the wafer stage position error.

15. The method of claim 14, wherein the step of generating a wafer stage force further comprises:

determining the wafer stage position reference based on a wafer stage acceleration reference.

16. The method of claim 15 wherein the step of generating a stabilizing force further comprises:

determining the stabilizing force based on the wafer stage acceleration reference.

17. The method of claim 13, wherein the step of generating a wafer table force further comprises:

comparing a wafer table actual position with a wafer table position reference to determine a wafer table position error; and calculating the wafer table force based on the wafer table position error.

18. The method of claim 13, wherein the step of generating a correction force further comprises:

connecting the wafer table and the wafer stage to determine the correction force.

19. A method for making a wafer stage device to manufacture semiconductor wafers, comprising the steps of:

aligning at least one flexure in a plane with a wafer, the wafer being supported by a wafer table and positioned by a wafer stage;

restraining shifting motion of the wafer table in the plane aligned with the wafer, while allowing the wafer table to move in a direction normal to the plane; and generating a stabilizing force to stabilize the wafer table when the wafer stage is accelerated.

20. The method of claim 19, further comprising the step of:

providing a first feedforward control system to determine the stabilizing force.

21. The method of claim 19, further comprising the step of:

generating a correction force to stabilize the wafer stage from a leveling shift of the wafer table.

22. The method of claim 21, further comprising the step of:

providing a second feedforward control system to determine the correction force.

23. A wafer stage device for manufacturing semiconductor wafers, comprising:

a wafer stage to position a wafer, the wafer stage being subject to acceleration in response to a wafer manufacturing control system;

a wafer table to support the wafer, the wafer table having a predetermined center of gravity;

a set of flexures connecting the wafer table and the wafer stage, the set of flexures being substantially aligned in a plane with the wafer;

at least one actuator to stabilize the wafer table when the wafer stage is being accelerated; and a first feedforward controller to control a stabilizing output of the at least one actuator.

24. The wafer stage device of claim 23, further comprising:

a second feedforward controller connected between the wafer stage and the wafer table to correct the wafer stage position to cancel a leveling shift of the wafer table due to a rotation of the wafer table.

25. The wafer stage device of claim 23, wherein the set of flexures restrains shifting motion of the wafer table in the plane aligned with the wafer, and allows the wafer table to move in a direction normal to the plane.

26. The wafer stage device of claim 23, wherein each of the at least one actuator exerts a stabilizing force onto the wafer table to control a rotational motion of the wafer table with respect to the wafer stage.

27. The wafer stage device of claim 26, wherein the at least one actuator comprises at least a set of two actuators, each set being separated by a predetermined distance.

28. The wafer stage device of claim 26, wherein the at least one actuator is one of a voice-coil motor type actuator and an EI core actuator.

29. The wafer stage device of claim 23, wherein each of the at least one actuator exerts a stabilizing torque onto the wafer table to control a rotational motion of the wafer table with respect to the wafer stage.

30. A wafer stage control system for stabilizing a wafer table in a wafer manufacturing process, the wafer table supporting a wafer, a wafer stage being subject to acceleration in response to a wafer manufacturing control system to position the wafer table, comprising:

at least one flexure substantially aligned in a plane with the wafer and connecting the wafer table to the wafer stage;

at least one actuator mounted on the wafer stage to generate an output to stabilize the wafer table when the wafer stage is being accelerated; and a first feedforward control system to control the output of the at least one actuator by determining a stabilizing force to be exerted on the wafer table to counteract a rotational motion of the wafer table caused by an acceleration of the wafer stage.

31. The wafer stage control system of claim 30, further comprising:

a second feedforward control system connected between the wafer stage and the wafer table to correct the wafer stage position to cancel a leveling shift of the wafer table due to a rotation of wafer table.

32. The wafer stage control system of claim 30, wherein the at least one flexure restrains shifting motion of the wafer table in the plane aligned with the wafer and allows the wafer table to move in a direction normal to the plane.

33. The wafer stage control system of claim 30, wherein the at least one actuator comprises at least a set of two actuators, each set being separated by a predetermined distance, and each set outputting a stabilizing force to be exerted onto the wafer table to control a rotational motion of the wafer table with respect to the wafer stage.

34. The wafer stage control system of claim 33, wherein the at least one actuator is one of a voice-coil motor type actuator and an EI core actuator.

35. The wafer stage control system of claim 30, wherein each of the at least one actuator outputs a stabilizing torque to be exerted onto the wafer table to control a rotational motion of the wafer table with respect to the wafer stage.

36. A lithography system comprising:

an illumination system that irradiates radiant energy:

a wafer stage device that carries an object disposed on a path of said radiant energy, and the wafer stage control system according to claim 1, said wafer stage control system being connected to the wafer stage device.

37. A device on which an image has been formed by the lithography system of claim 36.

38. A lithography system comprising:

an illumination system that irradiates radiant energy; and a wafer stage device according to claim 23, said wafer stage device carries the wafer disposed on a path of said radiant energy.

39. A device on which an image has been formed by the lithography system of claim 38.

40. A lithography system comprising:

an illumination system that irradiates radiant energy;

a wafer stage device that carries an object disposed on a path of said radiant energy, and the wafer stage control system according to claim 30, said wafer stage control system being connected to the wafer stage device.

41. A device on which an image has been formed by the lithography system of claim 40.

* * * * *

UNITED STATES PATENT AND TRADEMARK OFFICE
CERTIFICATE OF CORRECTION

PATENT NO. : 6,504,162 B1 Page 1 of 1
DATED : January 7, 2003
INVENTOR(S) : Michael Binnard et al.

It is certified that error appears in the above-identified patent and that said Letters Patent is hereby corrected as shown below:

<u>Title page,</u>
Item [57], ABSTRACT,
Line 9, "flexure's" should read -- flexures' --.

<u>Column 15,</u>
Line 18, "an wafer" should read -- a wafer --.

<u>Column 17,</u>
Line 11, "energy:" should read -- energy; --.

Signed and Sealed this

Twenty-fifth Day of March, 2003

JAMES E. ROGAN
*Director of the United States Patent and Trademark Office*